United States Patent [19]
Kawata et al.

[11] Patent Number: 5,426,784
[45] Date of Patent: Jun. 20, 1995

[54] SERIAL TO PARALLEL DATA CONVERTING CIRCUIT

[75] Inventors: Atsumi Kawata, Urawa; Hirotoshi Tanaka, Kokubunji; Hiroki Yamashita, Hachioji; Kenji Nagai, Iruma; Minoru Yamada, Hannou; Nobuhiro Taniguchi, Hadano, all of Japan

[73] Assignee: Hitachi, Ltd., Tokyo, Japan

[21] Appl. No.: 16,532

[22] Filed: Feb. 11, 1993

[30] Foreign Application Priority Data

Mar. 10, 1992 [JP] Japan .................. 4-051302

[51] Int. Cl.⁶ .............................................. G06F 1/04
[52] U.S. Cl. ........................... 395/800; 395/550;
364/238.7; 364/239.2; 364/DIG. 1; 365/219
[58] Field of Search ............... 395/800, 250, 550;
364/DIG. 1; 365/219

[56] References Cited

U.S. PATENT DOCUMENTS

| | | | |
|---|---|---|---|
| 4,048,673 | 9/1977 | Hendrie et al. | 428/425.8 |
| 4,157,458 | 6/1979 | Roche | 370/112 |
| 4,692,641 | 9/1987 | Highton | 307/475 |
| 5,223,833 | 6/1993 | Akata | 341/100 |

FOREIGN PATENT DOCUMENTS 3-12494  2/1991  Japan .

OTHER PUBLICATIONS

Yamanaka, et al., "Novel Structure for High-Speed Multihighway Serial-to-Parallel Converter", IEEE Nov. 1988, pp. 1221–1225.

Primary Examiner—Alyssa H. Bowler
Assistant Examiner—Dzung C. Nguyen
Attorney, Agent, or Firm—Fay, Sharpe, Beall, Fagan, Minnich & McKee

[57] ABSTRACT

A shift register 10 receives serial data and outputs parallel data in synchronism with the timing of the serial data received. A shift register group 20, 21 receives bit outputs of the parallel data from the shift register 10. The number of bits of shift registers 20, 21 in the shift register group is set in a certain condition that corresponds to the bit outputs of the parallel data from the shift register 10. A plurality of coincidence circuits 107, 108 are provided, which detects agreement between a preset data starting pattern and the bit arrangement of the data in the shift register group. A selector 306 selects a set of parallel outputs from the shift register group according to the output signal from the coincidence circuits 107, 108. Thus only the shift register 10, performs high-speed operations at the same timing as the received serial data, and the other circuits operate at slower speeds whose timing is several times longer than that of the serial data received, thereby eliminating complex timing and averting difficulty control logic.

11 Claims, 6 Drawing Sheets

SERIAL TO PARALLEL DATA CONVERTING CIRCUIT

BACKGROUND OF THE INVENTION

The present invention relates to serial/parallel signal conversion used in data communications; more particularly the invention relates to a data processing that detects, from serial input data, a control pattern representing a starting position of data, according to the control pattern performs a self-control to convert the serial input data into parallel data and executes ultrahigh speed processing on the converted parallel data.

Among the known conventional data processing systems that convert serial data into parallel data is the Japanese Patent Publication No. 12494/1991.

SUMMARY

It is an object of the present invention to analyze a general serial to parallel data conversion circuit to identify problems relating thereto, the sources of the problems, and to provide solutions to such problems.

Figure 5:
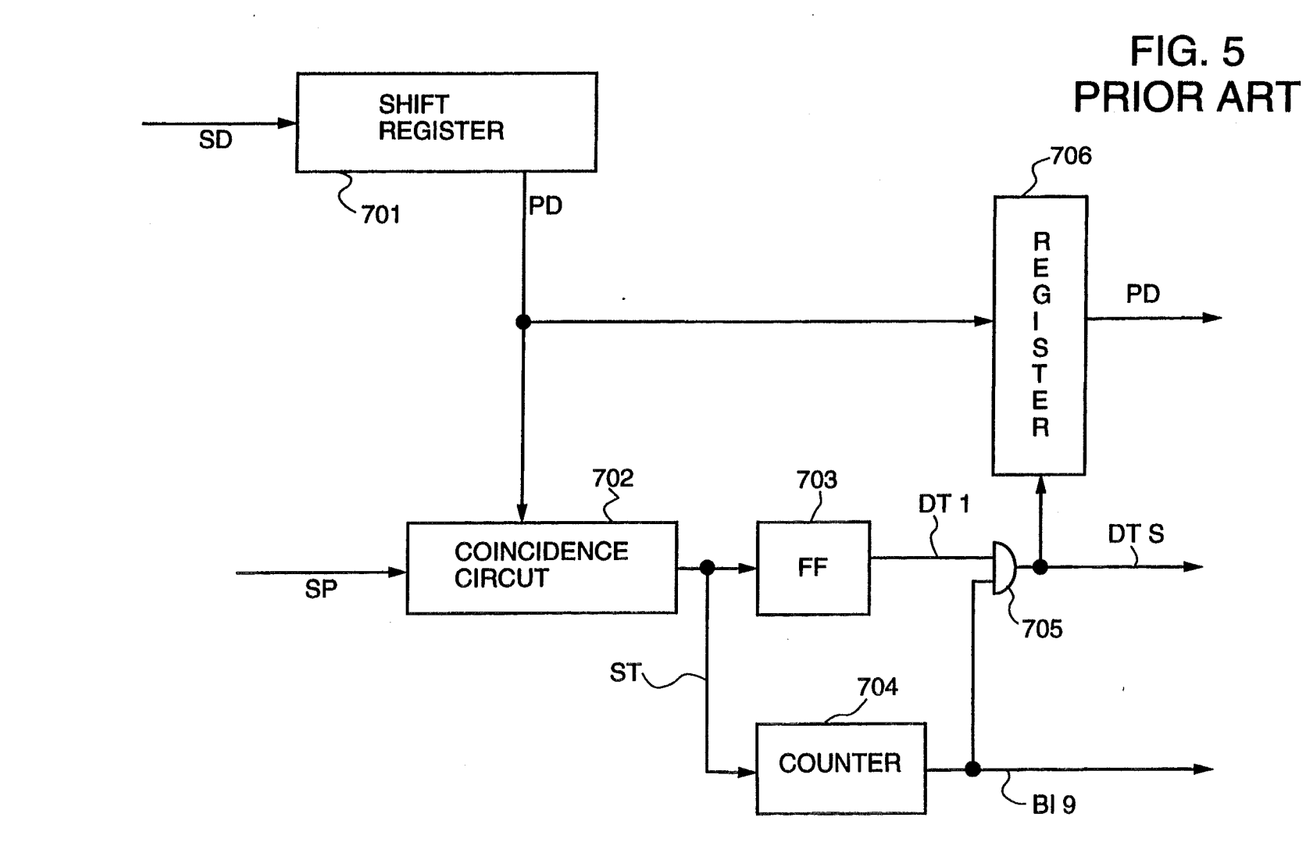
FIG. 5 is a block diagram of a serial-parallel conversion system that does not employ the features of the present invention, which is useful in accordance with the present invention for analysis.
Figure 6:
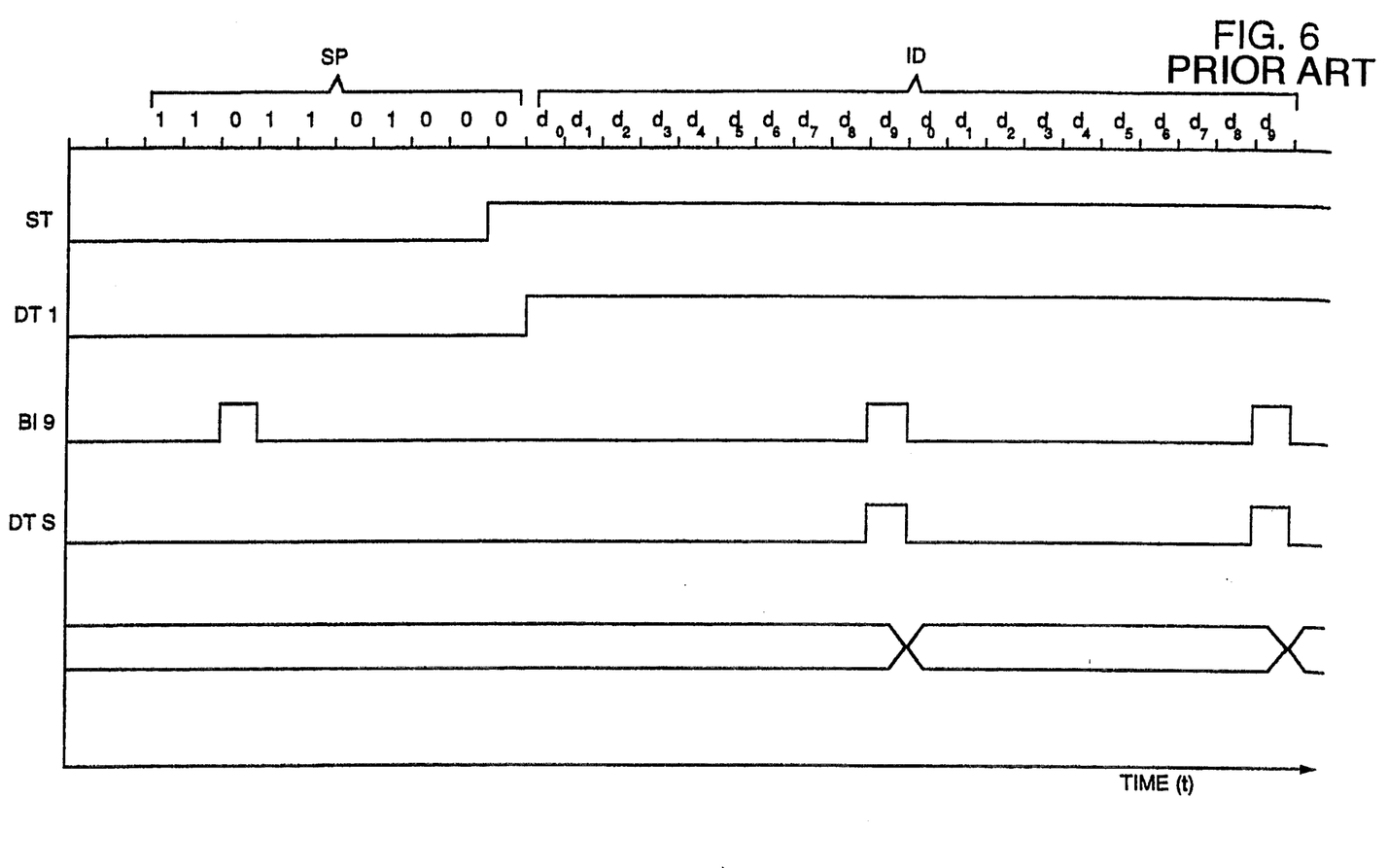
FIG. 6 is a synchronized wave form diagram showing the working principle of the system in accordance with FIG. 5.

FIG. 5 shows a conventional serial-parallel data conversion circuit. FIG. 6 is a synchronized timing diagram showing the operation of the serial-parallel data conversion circuit of FIG. 5.

Serial data SD received in a data communications system, includes header data representing the starting position of each unit of information data as shown in FIG. 6. In the case of a 10 bit unit of serial information data ID, $d_0$–$d_9$, a shift register 701 is made up of 10 bits and outputs 10-bit parallel data PD, which is sent out through a register 706 as parallel data PD.

When a starting signal, e.g. data pattern "1101101000" of data is to be identified from the received serial data SD, the serial data SD is shifted one bit at a time in shift register 701 and output from the shift register 701 for successive comparison (at each shift) with a preset starting pattern SP of data by a coincidence circuit 702. The coincidence circuit 702 produces a data starting signal ST when the data pattern PD output from the shift register 701 agrees with the preset starting pattern SP of data. The starting signal ST is set in a flip-flop (FF) 703 and at the same time resets a 10-bit counter 704. Now, the 10-bit counter 704 starts counting and outputs a signal BI9 after every 10 bits. The signal BI9 and the output signal DT1 from the flip-flop 703 are fed to an AND circuit 705 which produces a data timing signal DTS. The parallel data PD output from the shift register 701 is entered as is into a 10-bit register 706 where it is latched in synchronism with the data timing signal DTS. The latched parallel data PD is output from the register 706 as parallel data PD, having bits $d_0$–$d_9$. In FIG. 6, it is seen that the logic 702, 703, 704, 705 must operate at three times the speed/frequency of the serial data, or if only at the same frequency then an extra bit after the start pattern and before the first data bit $d_o$ would be needed to provide a data delay sufficient for the logic propagation time.

The conventional system, described above, requires that parallel data PD be taken into the shift register 701 according to the data timing signal DTS, and other circuits such as the coincidence circuit 702 and register 706 must be operated at the corresponding timing. There are three stages of logic, i.e., the coincidence circuit 702, flip-flop 703 and AND circuit 705, requiring a circuit speed three times as fast as that of transfer between registers 701, 706, DD, which makes the realization of the control logic difficult. All the registers, such as 701, 706 are required to operate at the data transfer speed, thus increasing the range of the circuit that must operate at high speeds to the entire circuit system. This in turn necessitates the timing design to be performed in a wide speed range with high precision.

In this way, the conventional technique has timing design difficulty in the logic of the control and it is required that the timing design be done with high precision over the entire circuit system. However, there is no known method of forming shift registers that can cope with this problem.

In a data processor which performs a self-control function while detecting a control signal from serial data and converting the serial data into parallel data, the object of this invention is to make only a part of the circuit system, rather than the entire circuit system, operate at high speed, thereby eliminating complexity in the timing design and at the same time averting the difficulty in realizing the logic of the control system.

To achieve the above objective, the data processor according to this invention which performs the serial-parallel conversion comprises: a first shift register which shifts the received serial data successively in synchronism with the reception timing of the input serial data and converts the serial data into parallel data of L bits as an output; a shift register group consisting of L second shift registers each of which receives a corresponding one of L parallel bits from the first shift register, the shift register group shifting the received bits in synchronism with a timing signal whose period is L times longer than the timing period of the first shift register and then outputting the shifted bits in parallel; and a selector which receives the parallel bits from the shift register group and selectively outputs N-bit data in parallel.

The data processor of this invention further comprises: a plurality of coincidence circuits which detect agreement between specified bits output from the shift register group and a preset bit pattern; a control circuit which receives outputs from the coincidence circuits and controls the selector accordingly; a timing generation circuit controlled by an output from the control circuit; and a parallel register which takes in the output of the selector according to an output from the timing generation circuit.

The first shift register takes in the received serial data and outputs the parallel data to a group of shift registers. The group of shift registers, although they operate at slower speeds than the first shift register, have a function to hold at one time all the bits of a data starting signal of the parallel data output from the first shift register in any case. This requires only the first shift register to operate at high speed in synchronism with the input serial data, permitting the shift register group and control system logic to perform at slower speed. As a result, it is possible to eliminate the complexity that would otherwise accompany the timing design and the difficulty in realizing the control system logic.

BRIEF DESCRIPTION OF THE DRAWINGS

Further objects, features and advantages of the present invention will become more clear from the following detailed description of a preferred embodiment, as shown in the accompanying drawings, wherein.

DETAILED DESCRIPTION OF PREFERRED EMBODIMENTS

Figure 1:
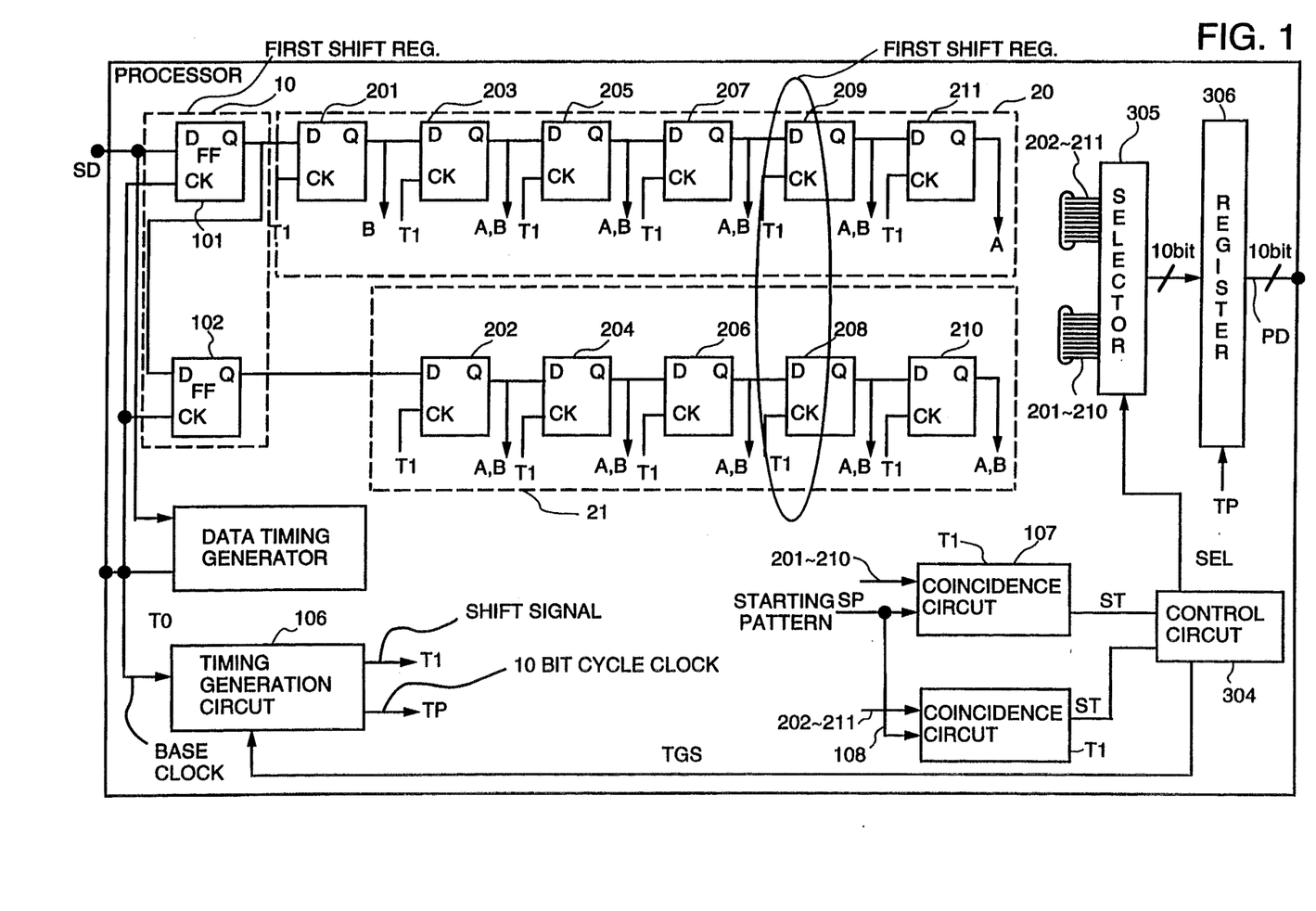
FIG. 1 is a block diagram showing the configuration of the serial-parallel conversion system according to one embodiment of the present invention.

FIG. 1 shows one embodiment of the serial-parallel processor, entirely on a single chip, according to this invention.

In FIG. 1, the input serial data SD has, e.g., 10 bits (N=10) of information data and is fed to a first shift register 10. The shift register 10 has two bits and is made up of two flip-flops (FF) 101, 102. The input serial data SD is fed to the FF 101, and the FF 101 and FF 102, in synchronism with a base clock source TO, which shift the input serial data successively and together produce two-bit parallel data output. One of the bits of the two-bit parallel data output from the first shift register 101 is input to a shift register 20 while the other bit is input to a shift register 21. These shift registers 20, 21 form a shift register group. The shift register 20 has six flip-flops 201, 203, 205, 207, 209, 211 and converts serial data SD from FF 101 into 6-bit parallel data. The shift register 21 has of five flip-flops 202, 204, 206, 208, 210 and converts serial data from FF 102 into 5-bit parallel data. The shift registers 20, 21, in synchronism with a clock T1 generated by a timing generation circuit 106, shift the serial input data DS successively and output parallel data PD according to the bit numbers of the shift registers. The timing generation circuit 106 divides the base clock source signal TO in half (two shift registers 20, 21) to produce a clock signal T1 to be supplied to the shift registers 20, 21. The outputs from the shift registers 20, 21 are collected into two groups—a group consisting of parallel outputs from FFs 202 to 211 and a group of parallel outputs from FFs 201 to 210—and fed into a two to one selector 305. The two parallel output groups from the shift registers 20, 21 are also sent to coincidence circuits 107, 108 respectively where they are compared with a starting pattern of data SP. The coincidence circuits 107, 108 output a start signal ST to a control circuit 304 when the parallel data from one of the shift registers 20, 21 agrees with the starting pattern SP. The control circuit 304, upon receiving the starting signal ST from the 10 bit coincidence circuit 107 or 108, outputs a selection signal SEL to the selector 305, which in turn selects the corresponding one of the two groups of parallel outputs fed from the shift registers 20, 21. At the same time, the control circuit 304 sends a trigger signal TGS to the timing generation circuit 106. Upon reception of the trigger signal TGS, the timing generation circuit 106 produces a timing signal TP after every 10 bits of input serial data SD, i.e., every 10 cycles of the base clock source signal TO. One of the parallel output signal groups 202–211 or 201–210 from the shift registers 20, 21 that was selected by the selection signal SEL with selector 305 is entered into a parallel register 306, which, according to the timing signal TP, latches and outputs the parallel data PD supplied from the selector 305.

In FIG. 1 the reference symbols A, B shown as the destinations of outputs from FFs 201 to 211 indicate that the outputs are fed to the coincidence circuits 107, 108, respectively.

Next, the operation of the circuit shown in FIG. 1 will be explained in detail by referring to the synchronized data wave form timing diagrams in FIGS. 2 and 3.

Figure 2:
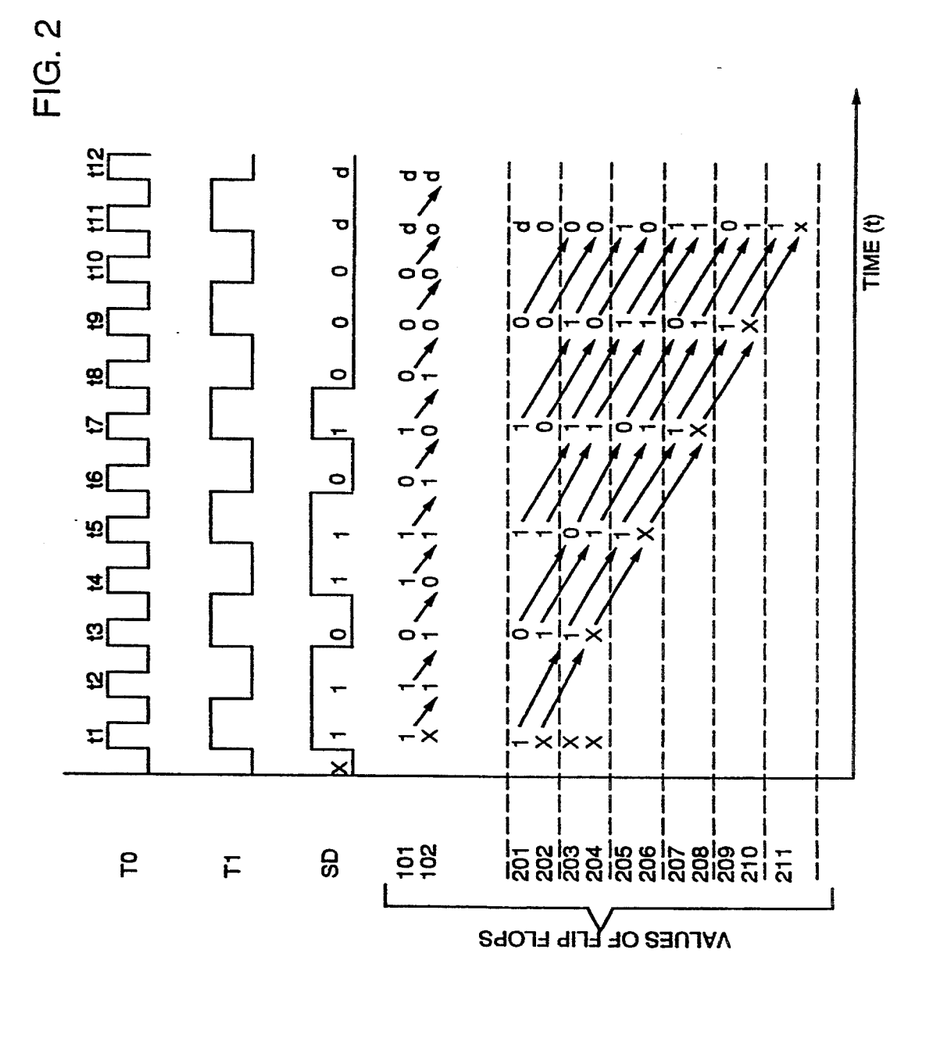
FIG. 2 is a synchronized wave form diagram showing the working principle of the embodiment of FIG. 1.
Figure 3:
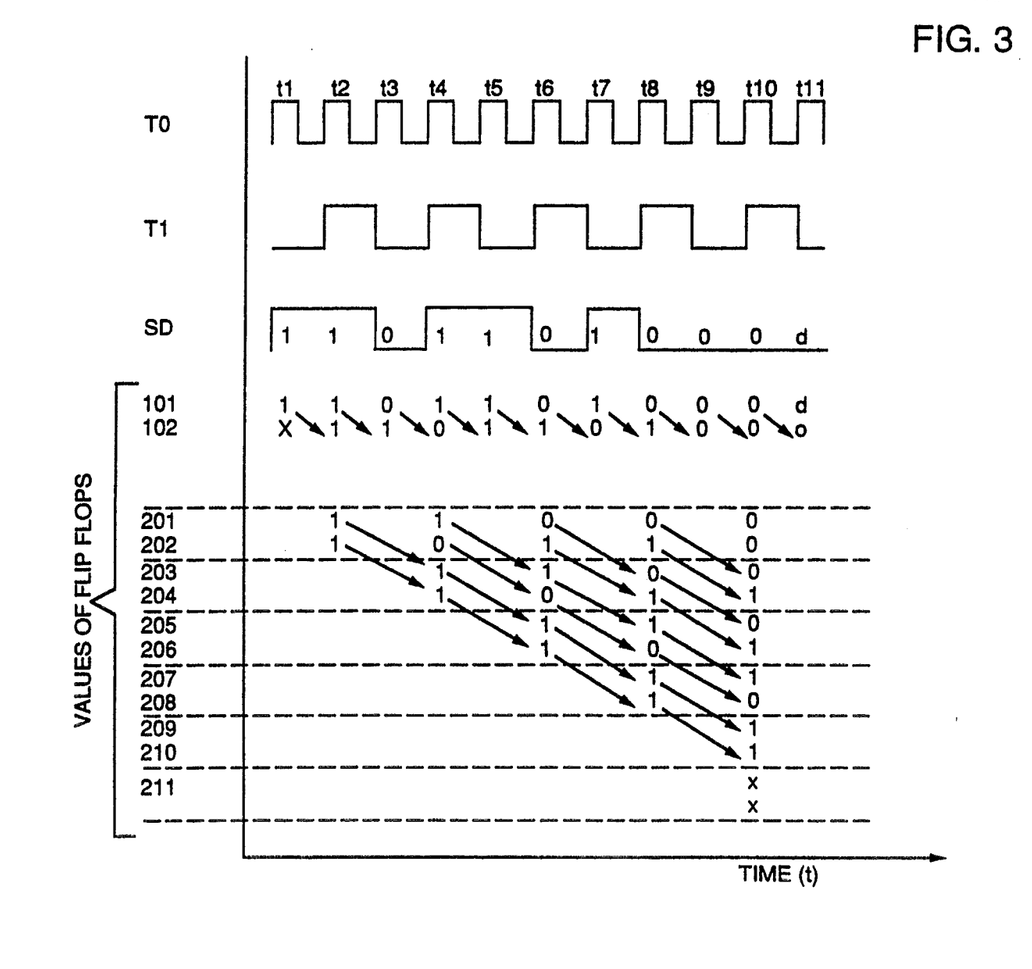
FIG. 3 is a synchronized wave form diagram further showing the working principle of the embodiment of FIG. 1.

FIG. 2 shows T1 to be "1" at the first bit of the starting pattern "1101101000" at time t1, and FIG. 3 shows T1 to be "1" at the second bit of the data starting signal, at time t2.

First, let us turn to the timing diagram of FIG. 2 for explanation about the circuit operation. In FIG. 2, the status at time t, is considered. In the shift register 10, at time t1, FF 101 is set with data "1" and FF 102 with indefinite data "X" which has existed before t1. At this time t1, since T1=1, the data "1" and "X" of FF 101 and FF 102 of the shift register 10 are set in FF 201 and FF 202 of the shift register 20. At the next timing t2, the data "1" of FF 101 of the shift register 10 is shifted to FF 102, and FF 101 is set with new input data "1". At this time t2, T1=0, so that the states of the shift registers 20, 21 do not change (only changed values are shown). At t3, FFs of the shift register 10 are set with "0" and "1" respectively. At this time t3, since T1=1, FF 201 of the shift register 20 and FF 202 of the shift register 21 are set with "0" and "1" respectively and the old data of FF 201 and 202 are shifted to FF 203 and 204, so that FF 203 and 204 are set with "1" and "X" respectively In this manner, the shift registers 20, 21 shift the data successively at the period of T1, which is two times the period of T0, and at the same time shift registers 20, 21 output parallel data to the coincidence circuits 107, 108. At time t11, the starting pattern SP is output as parallel data of FFs 202–211. When the coincidence circuit 108 detects agreement between the parallel data of FFs 202–211 and the preset starting pattern SP of data at t11, the control circuit 304, upon reception of the starting signal ST from the coincidence circuit 108, sends the selection signal SEL to the selector 305. According to the selection signal SEL from the control circuit 304, the selector 305 chooses the group of parallel outputs from FFs 202–211 and prepares this group of data to be sent out to the parallel register 306. The control circuit 304 sends the trigger signal TGS to the timing generation circuit 106, which, according to the trigger signal TGS, produces a timing signal TP after every 10 bits of the input serial data arriving after the starting signal ST, in order to cause the parallel register 306 to output the converted parallel data PD.

FIG. 3 shows the starting pattern SP to be the same as that of FIG. 2 but with the first bit sent out at the timing of T1=0. At time t1, FF 101 of the shift register 10 is set with data "1" and FF 102 with indefinite data "X", which existed prior to t1. At this time, t₁ since T1=0, the shift registers 20, 21 are not set with data. AT time t2, the data of FF 101 of the shift register 10 is shifted to FF 102, and FF 101 is set with the next input data "1". As a result, FF 101 and 102 contain data "1" and "1" respectively. At this time t2, since T1=1, FF 201 of the shift register 20 and FF 202 of the shift register 21 are set with "1" and "1" respectively. At t3, FFs 101, 102 of the shift register 10 are set with "0" and "1" and, since T1=0, the states of the shift registers 20, 21 do not change. Next, at time t4, the shift register 10 has its FFs 101, 102 set with "1" and "0". Since at this time t4, T1=1, FF 201 and 202 of the shift registers 20, 21 are set with "1" and "0" while at the same time the old data of FF 201 of the shift register 20 is shifted to FF 203 and that of FF 202 of the shift register 21 to FF 204, so that FF 203 and FF 204 contain "1" and "1". At time t10, the starting pattern is held in FFs 201–210 and the coincidence circuit 107, to which the outputs of FF 201–210 are connected, produces a starting signal ST. At the same time t10, the control circuit 304 sends to the selector 305 the select signal SEL for selecting the group of parallel outputs from FFs 201–210 out of the two parallel outputs of group 20, 21. This is followed by the same operation as executed in FIG. 2.

As is seen from FIG. 2, in a case where the total number of outputs of the shift register group made up of shift registers 20, 21 is 10 bits, when the first bit of the starting pattern and the previous bit are set to FF 101 and 102 of the shift register 10, it may not be possible to hold simultaneously all the 10 bits of the starting pattern depending on the timing of the first bit of the starting pattern, because the shift registers 20, 21 operate at a period two times larger than that of the shift register 10. This makes it impossible to detect the starting pattern in only one shift register 20 or 21. Even after the starting pattern has been detected, the 10 bits of information data ID, $d_0$–$d_9$, cannot be held in a single shift register, making the configuration of the parallel register and the control logic complex. For this reason, the present invention provides a plurality of shift registers 20, 21, the shift register 20, to which the first output of the shift register 10 (output of FF 101) is supplied, is made up of six bits and the shift register 21, to which the second output (output of FF 102) is supplied, is made up of five bits. This arrangement of the shift registers permits all of the 10 bits of the starting pattern to be held in the shift register group at one time, so that the coincidence circuits 107, 108 with connections corresponding to the bit arrangement of the starting pattern held in the shift register group outputs the starting signal ST to the control circuit 304.

In other words, the number of bits in the shift register group 20, 21 is set in a certain condition that corresponds to the parallel data output of the shift register 10 to which serial data is supplied. A plurality of coincidence circuits are provided which detect the agreement between the preset starting pattern SP and the bit arrangement of the data in the shift register group. A function is provided for selecting a set of parallel outputs (201–210 or 202–211) from the shift register group 20, 21 according to the output starting signal ST of these coincidence circuits. With this circuit arrangement, it is possible to make only the first shift register, to which the serial data is supplied, perform at high speed TO while permitting the shift registers 201–210 making up the shift register group 20, 21 and the control system logic 107, 108, to operate at lower speed T1.

While the above embodiments show example cases where T1 is "1" for the first bit of the data starting signal, FIG. 2, and where T1 is "1" for the second bit FIG. 3, it should be noted that the embodiments cover all possible cases that may occur and that any situation with T1 is either "1" or "0" for any arbitrary first bit of the starting pattern SP can be represented by one of the above two cases. Although in the example cases, N is the number of parallel bits to be output in the parallel data PD, L is the integer multiple of the data clock period, L is the number of shift registers in the group and number of coincidence circuits and the number of bits in the starting pattern are N=10 while L=2, these values can be arbitrary ones.

Figure 4:
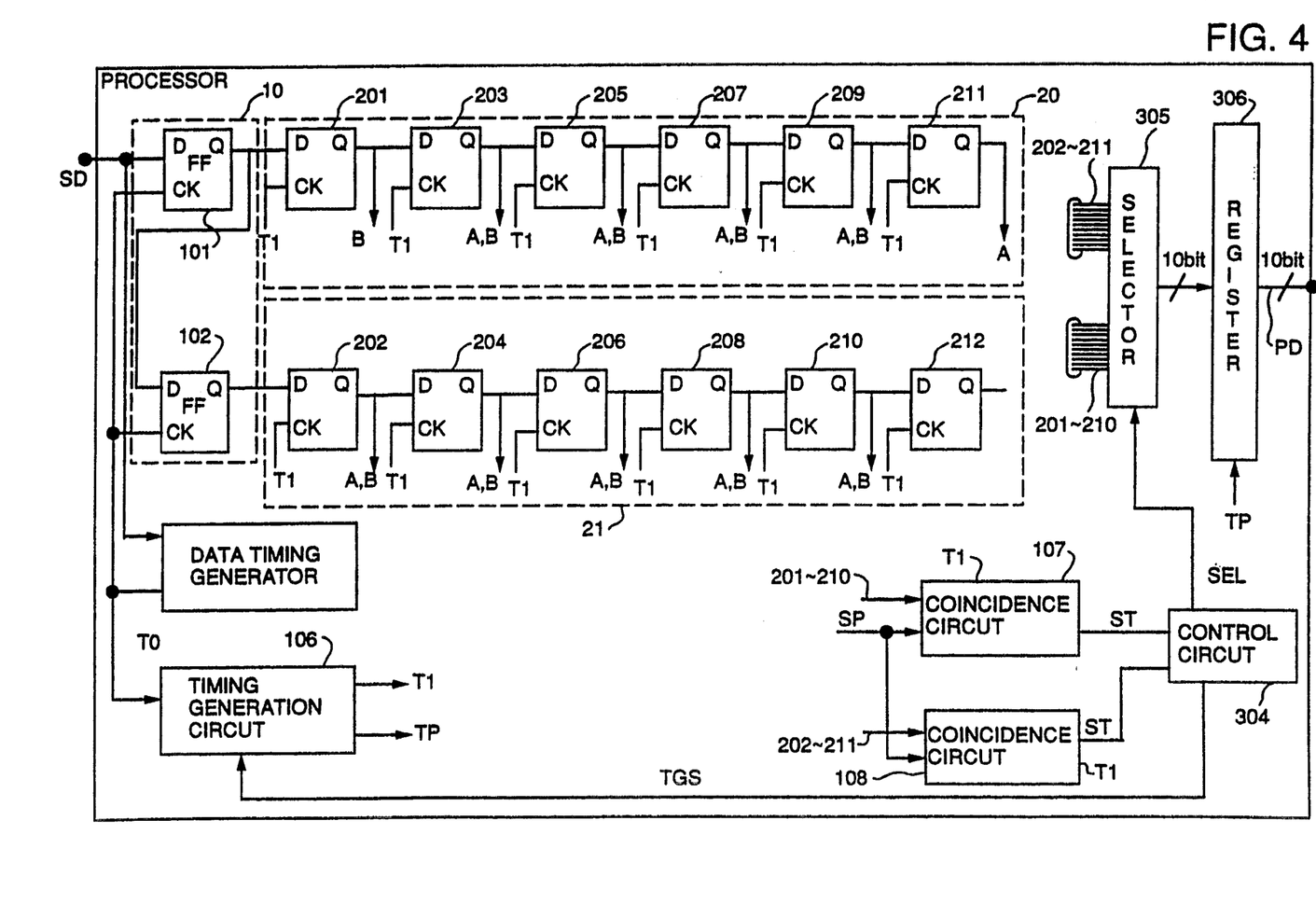
FIG. 4 is a block diagram showing the configuration of a serial-parallel conversion system according to another embodiment of the present invention.

FIG. 4 shows a further embodiment in which the first shift register 10 has two bits and the shift registers 20, 21 making up the shift register group have the same configurations, each consisting of six bits. As long as the shift registers in the shift register group meet the requirement of the bit arrangement of (N/L+L−1), the shift registers may have a larger number of bits.

As mentioned above, in a data processor which performs a self-control function while detecting a starting pattern from serial data and converting the serial data into parallel data, this invention requires only a part of the circuit to operate at high speed having the same timing as the received serial data and allows the other parts of the circuit to perform at slower speed whose timings are several times longer than that of the received serial data. As a result, it is possible to eliminate the complexity of the timing design and also the difficulty in realizing the logic of the control system.

While the preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A data processor, which receives input serial data having a data timing and delivers output parallel data N bits wide where N is an integer, comprising:
   a first shift register for receiving the input serial data successively in synchronism with the data timing and for converting the input serial data into parallel data L bits wide, where L is an integer, as an output;
   a plurality of second shift registers, the integer L in number, each of which receives a corresponding one of the L bits wide parallel data from said first shift register, shifts the received bits in synchronism with a timing signal whose period is the integer L times longer than the period of the data timing of the first shift register and then outputs parallel bits;
   selector means for receiving the parallel bits from said second shift registers and for selectively delivering less than all of the parallel bits as the N bits wide output parallel data;
   a plurality of coincidence circuits, the integer L in number, for detecting agreement between specified parallel bits output from said second shift registers and a preset bit starting pattern to provide an output data start signal; and
   a control circuit for receiving the output data start signal from said coincidence circuits and controlling output of said selector means accordingly;
   wherein each of said second shift registers has at least N/L bits and at least one of said second shift registers has N/L+1 bits.

2. A data processor as claimed in claim 1, being integrated entirely on a single chip.

3. The processor of claim 1, further including said control circuit having means responsive to receiving the output data start signal for producing a selector signal correlated to start of information data in the input serial data and providing the selector signal to said selector means.

4. A data processor as claimed in claim 1, being integrated entirely on a single chip.

5. A data processor for receiving input serial data having a data timing and converting the input serial data to output parallel data N bits wide where N is an integer, particularly for data communications, comprising:

means for providing a circuit timing signal having a period that is an integer L multiple of the period of the data timing, where the integer is 2 or greater;

at least the integer L in number of shift registers for inputting the input serial data and for outputting parallel data, each of said shift registers having flip-flops responsive to said circuit timing for shifting bits at said circuit timing;

input means for serially receiving the input serial data at the data timing, and holding at least the integer L in number of sequential bits of the input serial data and outputting the at least L sequential bits respectively to said L shift registers to be input respectively into said L shift registers at the timing of said circuit timing signal, whereby only the input means operates at the data timing and the L shift registers operate at a slower timing of the circuit timing signal;

selector means having parallel data inputs, the integer L in number, each connected to predetermined ones of the flip-flops of said L shift registers for receiving in parallel a different set of N bits that were sequentially adjacent in the input serial data and for selectively outputting in parallel one of the sets as the N bit wide output parallel data in accordance with a selector signal;

wherein each of said L shift registers holds at least N/L bits of the sequential input serial data and at least one of said L shift registers holds at least N/L+1 bits of the sequential input data.

6. The processor of claim 5, further including means responsive to a start pattern within the input serial data for producing the selector signal correlated to start of information data in the input serial data and providing the selector signal to said selector means.

7. A data processor as claimed in claim 5, being integrated entirely on a single chip.

8. A data processor for converting input serial data into output parallel data N bits wide, where N is an integer, comprising:

shift register means for inputting the input serial data at a data timing and outputting parallel data greater than N bits wide at a circuit timing less than the data timing;

a plurality of coincidence circuit means, operating at the circuit timing, each receiving different parallel data from said shift register means, for determining coincidence between the received parallel data and a predetermined start pattern for determining the start of information data in the input serial data, and producing a corresponding coincidence output signal; and selector means responsive to the coincidence output signal for selecting a plurality of bits N in number that were adjacent in the input serial data from among the greater than N bit wide parallel data of said shift register means and delivering the plurality of bits as the N bit wide output parallel data;

wherein said shift register means includes a first shift register operating at the data timing and a plurality of second shift registers operating at the circuit timing which is an integer 2 or greater in division than the frequency of the data timing;

said plurality of second shift registers having a timing out of phase with respect to one another by an amount corresponding to the period of the data timing; and a timing generation circuit for generating the circuit timing from the data timing;

wherein there are an integer L in number of said second shift registers each of said second shift registers holds at least N/L bits and wherein at lease one of said second shift registers holds N/L+1 bits.

9. A data processor as claimed in claim 8, being integrated entirely on a single chip.

10. A data processor for converting input serial data into output parallel data an integer N bits wide, comprising:

shift register means for inputting the input serial data at a data timing and outputting parallel data greater than the integer N bits wide;

coincidence circuit means operating at a circuit timing, receiving the greater than N bits wide parallel data from said shift register means, determining coincidence between at least a portion of the greater than N bits wide parallel data and a predetermined start pattern for determining the start of information data in the input serial data, and producing a corresponding coincidence output signal;

selector means operating at the circuit timing, being responsive to the coincidence output signal for selecting a plurality of bits, N in number, that were adjacent in the input serial data from among the greater than N bits wide parallel output of said shift register means, and delivering the plurality of bits as the N bits wide output parallel data;

said shift register means including a first shift register operating at the data timing and a plurality of second shift registers, an integer L in number, operating at the circuit timing wherein each of said second shift registers holds at least N/L bits and at least one of said second shift registers holds (N/L+1) bits;

said plurality of second shift registers having a timing out of phase with respect to one another by an amount corresponding to the period of a data timing; and a timing generation circuit for generating the circuit timing from the data timing.

11. A process for converting serial data of a data timing into output parallel data, an integer N bits wide, comprising:

generating a circuit timing having 1/L times a frequency of the data timing where L is an integer;

converting the serial data at the data timing with a first shift register that receives the input serial data and outputs parallel data into parallel data greater than N bits wide at the circuit timing with a plurality of second shift registers, the integer L in number, that receive the parallel data output from said first shift register;

holding at least N/L bits in said second registers and at least (N/L+1) bits in one of said second registers;

coincidence testing, at the circuit timing, the greater than N bit wide parallel data with a predetermined start pattern for determining a start of information data in the input serial data and producing a corresponding coincidence output signal; and selecting, in response to the coincidence output signal, a plurality of the bits, N in number, held in said holding step, that were adjacent in the input serial data from among the greater than N bit wide parallel data and delivering the plurality of bits as the N bit wide output parallel data.

* * * * *